US005621801A

United States Patent [19]

Kunimoto et al.

[11] Patent Number: 5,621,801

[45] Date of Patent: Apr. 15, 1997

[54] REVERBERATION EFFECT IMPARTING SYSTEM

[75] Inventors: Toshifumi Kunimoto; Masahiro Kakishita; Chifumi Takeuchi, all of Hamamatsu, Japan

[73] Assignee: Yamaha Corporation, Japan

[21] Appl. No.: 257,544

[22] Filed: Jun. 9, 1994

[30] Foreign Application Priority Data

Jun. 11, 1993 [JP] Japan .................................... 5-165083

[51] Int. Cl.$^{6}$ ....................................................... H03G 3/00

[52] U.S. Cl. ................................ 381/63; 381/61; 84/630; 84/661; 84/DIG. 26

[58] Field of Search .......................... 381/61, 63; 84/630, 84/707, DIG. 26, 661

[56] References Cited

U.S. PATENT DOCUMENTS

| | | | |
|---|---|---|---|
| 4,984,276 | 1/1991 | Smith | 381/63 |
| 5,187,313 | 2/1993 | Inoue | 84/DIG. 26 |
| 5,248,844 | 9/1993 | Kunimoto | 84/DIG. 26 |
| 5,256,830 | 10/1993 | Takeuchi et al. | 84/630 |

*Primary Examiner*—Curtis Kuntz
*Assistant Examiner*—Duc Nguyen
*Attorney, Agent, or Firm*—Graham & James LLP

[57] ABSTRACT

A reverberation effect imparting system includes plural comb filters, each of which has a signal delay line and a feedback loop for filtering a delayed output signal from the delay line and feeding the filtered signal back to the input side with a variable loop gain. The device further includes a junction section which receives the respective output signals from the delay lines of the plural comb filters. The junction section controls the received signals with respective variable scattering coefficients and sums up the thus-controlled signals, so as to introduce the summed signal into the feedback loop of each of the comb filters. In this manner, reverberation control according to the waveguide theory is performed by the junction section, while the conventional-type reverberation control is performed by the comb filters. Thus, reverberation can be controlled through a combination of the two controls.

15 Claims, 3 Drawing Sheets

REVERBERATION EFFECT IMPARTING SYSTEM

BACKGROUND OF THE INVENTION

The present invention relates to a reverberation effect imparting system for use with electronic musical instruments and various audio equipments, and more particularly to a reverberation effect imparting device which has enhanced applicability and controllability.

A typical example of the conventionally-known reverberation effect imparting devices is shown in FIG. 3, in which a delay line 1 delays an input electrical sound signal (hereinafter referred to simply as sound signal) so as to generate a delayed output signal corresponding to an optional delay time to thereby simulate initial reflected sounds. Plural comb filters CF1 to CFn which receive the output signal from the delay line 1 in a parallel fashion are provided for simulating reverberation sounds. One of the comb filters CF1 is composed of a multiplier IMU for variably controlling an input gain ig, a delay line DL for delaying the signal and a feedback loop for filtering the delayed output signal from the delay line DL and feeding the filtered signal to the input side with a variable loop gain lg. This feedback loop includes a low-pass filter LPF for simulating the loss of harmonic components, a multiplier FMU for controlling the variable loop gain lg to simulate a regular level-attenuation (loss) of reverberation sound signals, and a feedback adder (or subtracter) AD.

The delay time of the delay line 1, respective delay times of the comb filters, filtering coefficients and gain coefficients can be variably set so as to obtain desired initial reflected sounds and reverberation sounds. The illustrated example in FIG. 3 is one which is capable of imparting a stereo reverberation effect. For simplification, the following description will be given on only the left channel arrangement of the illustrated device. Delayed output signals corresponding to desired delay times are respectively provided from the delay line D1 in correspondence to a plurality (three in the illustrated example) of initial reverberation sounds. The delayed output signals are variably level-controlled by a multiplier MU1 and summed up by an adder ADD1, so as to obtain a summed initial reflected sound signal. On the other hand, delayed output signals corresponding to desired delay times are provided from the respective delay lines DL of the comb filters CF1 to CFn. The delayed output signals from the delay lines DL are then variably level-controlled by multipliers MU2 and summed up by an adder ADD2, so as to obtain a summed reverberation sound signal. Further, the output signal from the adder ADD2 is passed through serially connected all-pass filters APF1, APF2 to simulate scattering of rear reverberation sound. The initial reflected sound signal and reverberation sound signal output from the adders ADD1 and ADD2, respectively, are added together by an adder ADD3 and further added, in a suitable ratio, with the original sound signal having been imparted no reverberation. The resultant signal is output as a reverberation-effect-imparted signal Lout of the left channel. The above-mentioned operation takes place also in the right channel so that the resultant signal is finally output as a reverberation-effect-imparted signal Rout of the right channel.

U.S. Pat. No. 4,984,276 shows a signal processor employing a waveguide network and describes a technique (waveguide reverberator) in accordance with which an reverberation effect is imparted by using the waveguide network to simulate a physical reverberation mechanism in natural sound space such as audio rooms and concert halls. The disclosed waveguide reverberator forms a closed-type waveguide network by providing output signals from a plurality of parallel-connected waveguides (bidirectional signal transmission means containing delay lines) to a signal junction where the signals are multiplied by respective variable scattering coefficients and added together, and then redistributing the addition result to the waveguides. The disclosed arrangement makes it possible to simulate such complex reverberation where sounds are reflected in a spreaded manner or repeatedly reflected while taking a diffractive roundabout and also to simulate natural reverberation. Further, it is possible to control the reverberation by variably controlling the respective scattering coefficients used in the signal junction section.

However, the conventionally-known reverberation effect imparting devices using the comb filters as shown in FIG. 3 have a significant problem that only reverberation with some peculiarity such as flutter echo is achieved, because they are arranged so that a regular reflected sound is generated by each of the comb filters and complex reflection, i.e., reverberation is created by combinations of the reflected sounds thus generated by the plural comb filters.

In addition, because the initial reflected sounds and reverberation sounds are generated separately, the two kinds of sounds tend to be very poorly connected with each other. Namely, although, in reality, the initial reflected sounds are further reflected to produce additional reverberation, the prior art device is unable to simulate such a state, and thus an unwanted separation occurs between the initial reflected sounds and reverberation sounds.

Moreover, because the prior art device is designed to simulate scattering of rear reverberation sounds by the use of the all-pass filters provided outside the feedback loops of the comb filters, the device can not achieve real simulation of such a case where reverberation density or scattering density varies with time, and thus the simulation tends to be undesirably monotonous.

On the other hand, the second-mentioned device employing the waveguide theory is based on a reverberation effect impartment principle different from that of the conventionally well-known reverberation effect imparting devices employing comb filters as shown in FIG. 3, and therefore it can not utilize the control know-how that has been accumulatively acquired by this type of the well-known reverberation effect imparting devices. Further, some handling difficulties are often encountered in setting various coefficients and delay times, thus making it difficult to set reverberation characteristics as desired by users.

SUMMARY OF THE INVENTION

It is therefore an object of the present invention to provide a reverberation effect imparting system which allows a reverberation characteristic to be easily controlled by an user and further is capable of achieving a good-quality, natural reverberation characteristic.

To achieve the above-mentioned object, a reverberation effect imparting system in accordance with one aspect of the present invention comprises plural comb filter sections each adapted to receive a sound signal to which a reverberation effect is to be imparted, each of the comb filter sections including a closed loop having a delay element for delaying the sound signal and a section for controlling a loop gain, the reverberation effect being controlled by controlling respective characteristics of the plural comb filter sections, a takeout section for taking out the signals from optional points in the loops of the plural comb filter sections, a junction section for receiving the signals taken out from the plural comb filter sections and providing at least one output signal having a value that is a function of the received signals, the function being controlled by a control signal to thereby perform control for the reverberation effect, an introduction section for introducing the output signal from the junction section into optional points in the loops of the plural comb filter sections, and an output section for taking out the signal from at least one of the comb filter sections and the junction section and outputting a reverberation-imparted sound signal based on the taken-out signal.

The circuitry part comprising the plural comb filter sections is substantially equivalent to the conventionally-known reverberation effect imparting device and is capable of controlling reverberation effect by controlling the loop gains in the individual feedback loops in the conventional manner.

The junction section receiving the output signals from the delay lines of the plural comb filter sections may itself be equivalent to the one known as a waveguide network junction. But, as compared to the waveguide network where a signal junction is employed in the physical junction of waveguides in order to simulate signal scattering therein, the present invention is arranged to input signals taken out from the loops each constituting a complete closed loop. The junction section may be so designed that it controls the signals taken out from the loops of the comb filter sections by the use of respective variable scattering coefficients and sums up the controlled signals, so as to introduce the summed signal into the loop of each of the comb filter sections. By such arrangement to introduce the output signal from the junction section into the loop of each of the comb filter sections, the junction section can be constructed in a similar or identical manner to the waveguide network junction, and the waveguide theory can be applied to that section in a analogical manner.

A qualitative description on the operation to generate reverberation sound by the provision of such a junction section will be as follows. In the prior device, the signal introduced into a closed loop of each comb filter is comprised of only signal circulating through the loop, but according to the present invention, another signal introduced from the junction section is added to the signal and the other signal from the junction section may perhaps contain signal of the other comb filter sections which has appropriately been loss-controlled. This novel feature makes it possible to simulate complex reverberation characteristics. Thus, it is possible to achieve a complex, ie., natural reverberation effect which has never been attained by the conventional comb-filter-based reverberation effect imparting device. Further, by manipulation of the coefficients, it is allowed, if desired, to emphasize reverberation characteristics achieved by the conventional comb-filter-based technique. Accordingly, it is possible to achieve an intermediate reverberation between the reverberation based on the waveguide theory and the conventional-type reverberation, to thereby provide a reverberation effect imparting device which has novel, peculiar reverberation characteristics.

Referring to the controllability of the invention, desired reverberation control can be performed with utmost ease by a combination of two controls, i.e., control of loop gains in the comb filter sections and control of scattering coefficients in the signal junction section. Therefore, when controlling the loop gains in the comb filter sections, it is allowed to make use of the familiar control know-how that is commonly employed in the conventionally-known reverberation effect imparting devices based on comb filters, and the invention provides a very handy reverberation effect imparting technique. For example, if it is desired to achieve reverberation sound coloration peculiar to the comb-filter-based technique, it only suffices to control the scattering coefficients in such a manner that the signal introduced from the signal junction section becomes near zero and to thereby emphasize the characteristics achieved by the loop gain control in the comb filter sections.

A reverberation effect imparting system in accordance with another aspect of the present invention comprises plural comb filter sections each adapted to receive a sound signal to which a reverberation effect is to be imparted, each of the comb filter sections including a closed loop having a delay element for delaying the sound signal and a section for controlling a loop gain, the reverberation effect being controlled by controlling respective characteristics of said plural comb filter sections, a junction section for taking out and receiving the signals from optional points in the loops of the plural comb filter sections to control the signals with variable coefficients, the junction section further synthesizing the signals controlled with the variable coefficients so as to provide at least one output signal, an introduction section for introducing the output signal from the junction section into optional points in the loops of the plural comb filter sections, an output section for taking out the signals from the plural comb filter sections and outputting a reverberation-imparted sound signal by synthesizing the taken-out signals, and a dummy loop section for receiving the output signal from the junction section to control the signal with a variable coefficient and providing the controlled signal to the junction section.

The addition of the dummy loop section in conjunction with the junction section is very useful in that it can remarkably improve reverberation control performed by the signal junction. In the junction section, the signals from the comb filter sections may be variably controlled individually by scattering coefficients. Even when the scattering coefficients do not satisfy a predetermined lossless condition, the value of the variable coefficient in the dummy loop section will in a complementary manner with respect to said scattering coefficients so that the predetermined lossless condition is satisfied as a whole.

Now, the preffered embodiment of the present invention will be described in detail below with reference to the accompanying drawings.

BRIEF DESCRIPTION OF THE INVENTION

DETAILED DESCRIPTION OF THE INVENTION

Figure 1:
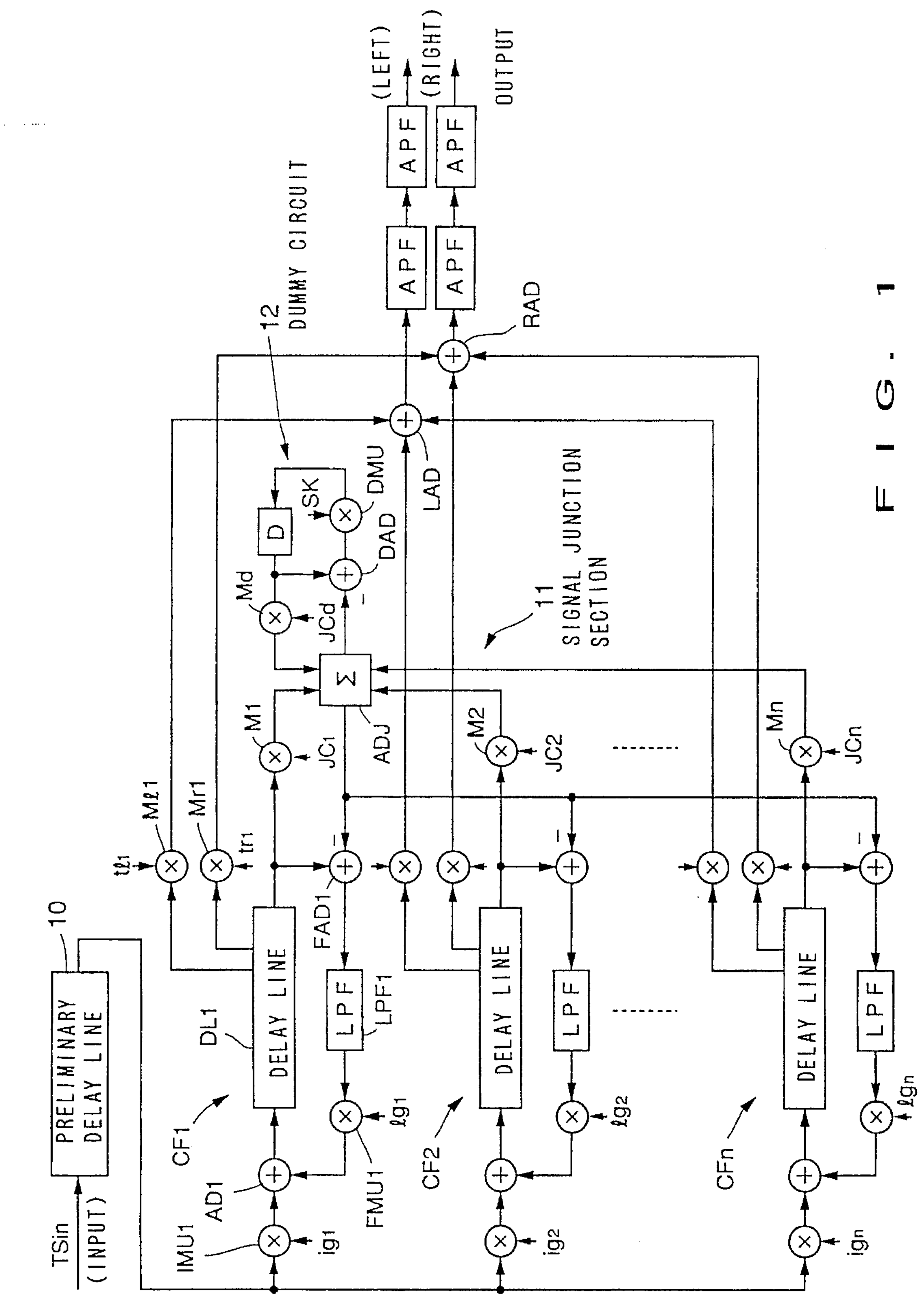
FIG. 1 is a block diagram of an embodiment of a reverberation effect imparting system in accordance with the present invention.

In an embodiment shown in FIG. 1, a tone signal Sin supplied from outside or from an unillustrated external tone source is first delayed a predetermined time by a preliminary delay line 10. This preliminary delay line 10 establishes part of a delay time for an initial reflected sound. Similarly to the prior art device as shown in FIG. 3, plural comb filters CF1 to CFn are provided in parallel fashion so that the output from the preliminary delay line 10 is fed to the individual comb filters CF1 to CFn in parallel.

Figure 3:
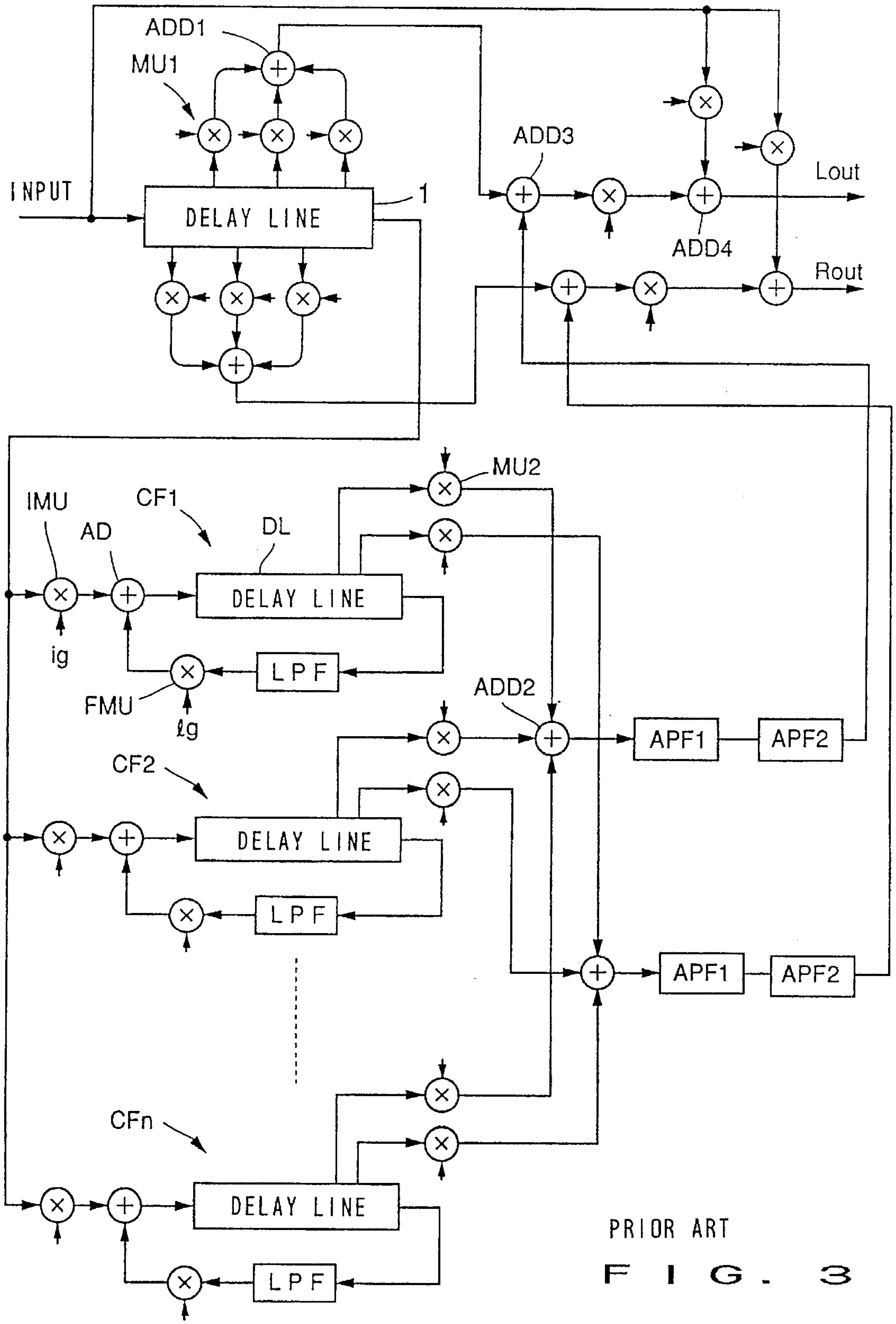
PRIOR ART FIG. 3
FIG. 3 is a block diagram of an example of a prior reverberation effect imparting device.

Each of the plural comb filters CF1 to CFn may be of the same structure as that employed in the prior art device shown in FIG. 3. Namely, the comb filter CF1, for example, is composed of a multiplier IMU1 capable of variably controlling an input gain ig1, a delay line DL1 for delaying the signal and a feedback loop for filtering the delayed output signal from the delay line DL1 and feeding the filtered signal back to the input side of the comb filter with a variable loop gain lg1. The feedback loop includes a low-pass filter LPF1 for simulating the loss of harmonics components, a multiplier FMU1 for controlling the variable loop gain lg1 so as to simulate a regular level attenuation (loss) of a reverberation sound signal, and a feedback adder (or subtracter) AD1. In addition, this feedback loop includes an adder FAD1 for introducing an output signal from a signal junction section 11 into the feedback loop. A left-channel output signal and a right-channel output signal are taken out from different delay positions of the delay line DL1. The left-channel and right-channel output signals are variably gain-controlled by respective multipliers Ml1 and Mr1 using a left-channel gain tl1 and a right-channel gain tr1, respectively. It should be understood that each of the other comb filters CF2 to CFn is constructed in the same manner as the comb filter CF1.

The above-mentioned signal junction section 11 includes multipliers M1 to Mn which receive the respective output signals from the delay lines DL1 to DLn of the comb filters CF1 to CFn and multiplies the received signals by respective variable scattering coefficients JC1 to JCn. The output signals from the multipliers M1 to Mn are summed by an adder ADJ. The summed signal from the adder ADJ is input, as a subtraction (or addition) signal, to the respective feedback-loop adders FAD1 to FADn of the comb filters CF1 to CFn. This signal junction section 11 views each of the comb filters CF1 to CFn as a virtual waveguide and simulates signal scattering in their junction (or their open ends). For example, the signal which is introduced from the signal junction section 11 to the feedback-loop adder FAD1 to FADn of each comb filter CF1 to CFn is considered as a return of a reflected wave signal when it is assumed that each of the comb filter CF1 to CFn is a waveguide.

Each of the scattering coefficients JC1 to JCn is variably chosen to be a value below "1", for example. Consequently, respective loss-controlled signals are summed and the summed signal is input to each feedback-loop adder FAD1 to FADn for subtraction from (or addition to) the signal of the corresponding loop so as to simulate signal scattering in a signal junction of a waveguide network. In other words, reverberation sounds generated through the comb filters CF1 to CFn scatter, in the junction section, with different scattering coefficients JC1 to JCn, and the sum total of such scattering signals is received into the feedback loops, for regular reverberation sounds, of the individual comb filters CF1 to CFn so that complex reverberation characteristics can be achieved.

In FIG. 1, a dummy circuit 12 is provided in conjunction with the signal junction section 11. This dummy circuit 12 is intended for an improvement in the reverberation imparting technique according to the present invention, but it may be omitted if such an improvement is not considered. Therefore, a description will be made, for the moment, on the assumption that the dummy circuit 12 is not provided in the embodiment.

With the above-mentioned arrangements, the user can variably control various coefficients, i.e., input gains ig, loop gains lg and channel gains tl and tr of the comb filters CF1 to CFn, as desired. Further, the respective scattering coefficients JC1 to JCn in the signal junction section 11 can also be variably controlled as desired. In this way, reverberation characteristics can be controlled as desired. Particularly, by controlling the respective loop gains lg of the feedback loops in the comb filters CF1 to CFn, it is possible to control the regular level attenuation of a reverberation tone of each channel. Further, by controlling the scattering coefficients in the signal junction section 11, the scattering states, in the junction section 11, of reverberation sounds generated through the comb filters CF1 to CFn are variably controlled, and thus it is possible to effectively control complex reverberation characteristics. Namely, by a combination of the two controls, the loop gain control in the comb filters and the scattering coefficient control in the signal junction section, it is possible to achieve desired reverberation control that is natural and rich in controllability.

For example, if it is desired to emphasize the reverberation control in the signal junction section 11, it is sufficient to only set the scattering coefficients JC1 to JCn accordingly. Conversely, if it is desired to achieve reverberation tone coloration peculiar to the comb-filter-based technique, it is sufficient to control the scattering coefficients in such a manner that the signal introduced from the signal junction section 11 becomes near zero and to thereby highlight the characteristics achieved by the loop gain control in the comb filters. The loop gain control in the comb filters can make use of the familiar control know-how widely employed in the conventionally-known reverberation imparting devices based on comb filters and hence the system can be easily used (controlled).

A further description will be made on examples of control performed in the embodiment.

If presence of the dummy circuit 12 is not taken into consideration, it is known from the waveguide theory that the lossless condition in the signal junction section 11 must satisfy the following equation:

Equation (1):

$$JC1+JC2+JC3+\ldots+JCn=2$$

This means that, if the value of each of the coefficients JC1 to JCn is variably set so as to satisfy the above equation, density of reverberation sounds derived during a certain reverberation time (reverberation amount), although the reverberation time is fixed, can be freely controlled by the values of the coefficients JC1 to JCn. In this case, the reverberation time can be controlled by the respective loop gains lg1 to lgn of the comb filters. Accordingly, if such control is performed as to maintain the above-mentioned lossless condition, separate control can be performed such that the reverberation time is controlled by the loop gain coefficients in the comb filters, while the reverberation density is controlled by the scattering coefficients in the junction, thus providing highly improved controllability.

As an example of variably controlling the coefficients while constantly maintaining the above lossless condition, the coefficients JC1 to JCn may be given in such a manner that they change in response to the user's operation but the sum total of the coefficients always remains at "2". But, of course, it should be appreciated that the present invention is not limited to such an example.

Our study has shown that, if the respective values of the coefficients JC1 to JCn are set to be equal, as stated in the following equation, when the control is performed while maintaining the lossless condition, the reverberation amount becomes considerably great and thus the reverberation sounds inconveniently result in white noise:

Equation (2):

$$JC1=JC2=JC3= \ldots =JCn=2/n$$

In order to avoid such inconvenience, it may be useful to set the coefficients JC1 to JCn to take on relatively small values and to lower the degree of coupling in the junction. But, in that case, the above lossless condition can not be satisfied as represented in the following equation:

Equation (3):

$$JC1+JC2+JC3+ \ldots +JCn<2$$

This causes substantial loss which produces fast signal attenuation, and the reverberation time is shortened. Consequently, it is not possible to perform sufficient reverberation control.

The dummy circuit 12 is intended for providing an improvement to deal with the above-mentioned problem. The dummy circuit 12 will now be described in detail below.

As shown in FIG. 1, the dummy circuit 12, which functions as a dummy waveguide connected to the signal junction section 11, includes a delay loop, an adder DAD for introducing the summed signal from the signal junction section 11 into the delay loop, and a multiplier Md for controlling the output signal from the delay loop with a variable scattering coefficient JCd and additively providing the controlled signal to the signal junction section 11. The delay loop of the dummy circuit 12 contains a one-sample delay circuit D and a multiplier DMU for calculating a coefficient SK that simulates a loss in the dummy waveguide. But, because the dummy waveguide is designed to act as a supply loop for the signal circulating to the signal junction section 11, the loss caused in the delay loop is normally chosen to be zero. Namely, the coefficient SK is set at "1" or "−1".

With such arrangements, the coefficient JCd of the dummy circuit 12 is also added to the lossless condition equation in the signal junction section 11 as follows:

Equation (4):

$$JC1+JC2+JC3+ \ldots +JCn+JCd=2$$

Thus, even if junction coefficients, i.e., scattering coefficients JC1 to JCn corresponding to the comb filters have been put into the relationship as represented in the above-mentioned equation (3), shortage can be covered by the dummy coefficient JCd so as to secure a necessary signal, so that there won't be caused the inconvenience that the reverberation time is undesirably shortened. Namely, if the sum total of the coefficients JC1 to JCn corresponding to the comb filters and of the dummy coefficient JCd are differentially controlled to satisfy the above-mentioned equation (4), it is allowed to secure the reverberation time while guaranteeing free control of the coefficients JC1–JCn corresponding to the comb filters. In this case, the reverberation time can be controlled by the loop gains lg1 to lgn of the comb filters, while the reverberation density can be controlled by the junction scattering coefficients. Such controls can be performed very easily and will cause no inconveniences as mentioned above.

A description will be made on examples of control of the coefficients JC1 to JCn and the dummy coefficients JCd. In the case where it is is desired to decrease the reverberation amount (reverberation density), the coefficients JC1 to JCn are controlled to be smaller and the dummy coefficient JCd is controlled to be greater. At this time, if the coefficients JC1 to JCn are decreased close to "0", only the reverberation time is controlled by control of the loop gains of the individual comb filters. Conversely, in the case where it is desired to increase the reverberation amount (reverberation density), the coefficients JC1 to JCn are controlled to be greater and the dummy coefficient JCd is controlled to be smaller. In this way, reverberation can be achieved which very closely approximates an actual waveguide reverberation.

Further, because the delay loop exhibits filter characteristics, the dummy circuit 12 provides the junction section 11 with a coupling that has frequency characteristics. When the coefficient SK is "1", the delay loop of the dummy circuit 12 functions as a low-pass filter, but the output signal from the dummy circuit 12 assumes a sign inverted from that of the input signal, so that the degree of coupling of the dummy circuit 12 in the signal junction section 11 becomes relatively small with respect to low-frequency signals.

On the other hand, when the coefficient SK is "−1", the delay loop function as a high-pass filter. Also in this case, the output signal from the dummy circuit 12 assumes a sign inverted from that of the input signal, so that the degree of coupling of the dummy circuit 12 in the signal junction section 11 becomes relatively small with respect to high-frequency signals.

Figure 2A:
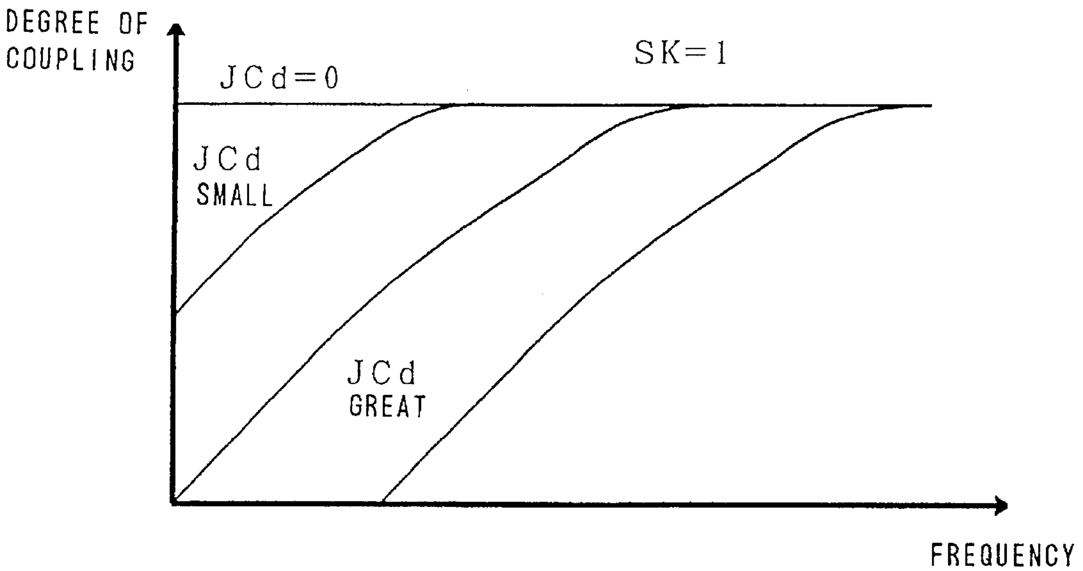
FIG. 2A is a graph explanatory of an example of control performed by a signal junction section of FIG. 1.
Figure 2B:
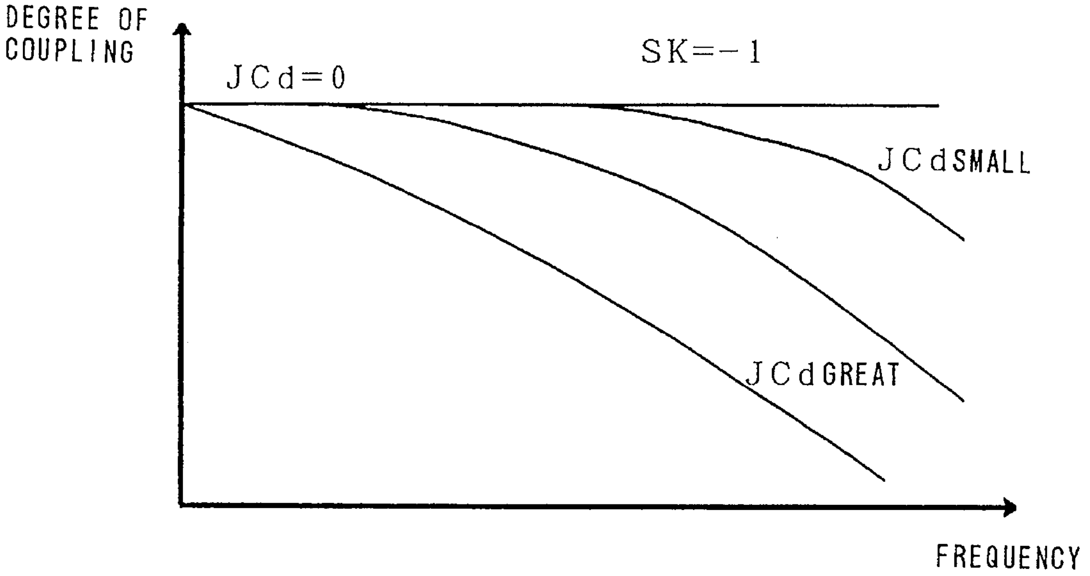
FIG. 2B is a graph explanatory of another example of control performed by a signal junction section of FIG. 1.

FIGS. 2A and 2B show, in graphic representation, two examples of the degree of coupling between the junction and the waveguides excluding the dummy circuit with respect to signal frequencies; namely, the figures represent the degree of coupling between the junction section 11 and the comb filters CF1 to CFn of the embodiment in the case where SK=1 and SK=−1. The characteristic levels are controlled depending on the magnitude of the dummy junction coefficients JCd.

The filter characteristics of the dummy circuit 12 may be other than simple low-pass or high-pass characteristics as mentioned above, such as more complex characteristics or all-pass filter characteristics.

Further, it is also possible to control the reverberation time by control of the junction coefficients JC1 to JCn and JCd or by the delay loop coefficient SK, instead of controlling the loop gains of the comb filters (fixing the loop gains at "1" or "−1"). As an example, the dummy junction coefficients JCd may be freely variably controlled, without satisfying the above equation (4), to thereby control the reverberation time. As another example, the delay loop coefficient SK in the dummy circuit 12 may be variably controlled with an absolute value below "1" (i.e., the coefficient SK may be provided as a loss coefficient), although the junction coefficients JC1 to JCn are variably controlled so as to satisfy the equation (4).

Referring back to FIG. 1, the left-channel output signals from the comb filters CF1 to CFn are added together by a left-channel adder LAD, while the right-channel output signals are added together by a right-channel adder RAD. The added output signals from the adders LAD, RAD are output via respective all-pass filters APF which impart additional short-time reverberation to the signals.

In the embodiment, there is provided no dedicated circuit for forming an initial reflected sound, and first signals to be output through the all-pass filters APF correspond to the initial reflected sounds. Thus, the initial reflected sounds circulate through the comb filters CF1 to CFn to produce succeeding reverberation sounds. This achieves a good coupling between the initial reflected sounds and the reverberation sounds.

The short-time reverberation imparted by the all-pass filters APF is preferred in that it can produce fine reflection deriving from the initial reflected sounds. Namely, because a sound wave travels through space as a spherical wave, the reflected wave, after having stricken a wall surface, is not a single wave but produces multiple fine reflected waves at very short intervals because of a time difference caused by the spherical surface. The all-pass filters on the output side can simulate such fine reflected waves.

Circuitry for adding reverberation sound signal to the input signal TSin is omitted in FIG. 1, but such circuitry may be provided in a manner as shown in FIG. 3.

In an alternative arrangement of the embodiment, it is possible to individually control the signals that are introduced from the junction section 11 into the respective adders FAD1 to FADn in the loops of the comb filters CF1 to CFn, by using multipliers and suitable coefficients. A further alternative arrangement may be such that the junction section 11 sums signals obtained by scattering-control the output signals from some of the comb filters CF1 to CFn and the resultant sum value is distributed to any of the comb filter loops.

The embodiment may be implemented by hardware circuitry as shown in the functional diagram of FIG. 1, or of course may be implemented by software processing via a microcomputer. Various signals handled in the embodiment and the processing circuits may either be digital or analog, although digital circuits are normally employed today.

Further, the function of the signal delay lines may be performed by a random access memory, and various operations and signal processing may be performed by a digital signal processor (DSP).

Furthermore, the reverberation effect imparting system of the present invention may be constructed as an independent reverberator which receives an electrical sound signal from outside and imparts a reverberation effect to the received sound signal, or may be incorporated within an electronic musical instrument.

According to the present invention as described above, it is possible to achieve an intermediate reverberation between the reverberation based on the waveguide theory and the conventional-type reverberation, and this hybrid reverberation can provide a reverberation effect imparting device which has novel, peculiar reverberation characteristics. Therefore, the present invention achieves the superior benefits that desired reverberation control can be performed with utmost ease by a combination of two controls, i.e., control of loop gains in the comb filters and control of scattering coefficients in the signal junction section, and also that it is possible to easily obtain complex, natural reverberation sound. For instance, when controlling the loop gains in the comb filters, it is allowed to make use of the familiar control know-how employed in the conventionally-known reverberation imparting devices based on comb filters. Further, by addition of the dummy circuit in conjunction with the signal junction section, it is possible to remarkably improve reverberation control performed by the signal junction.

What is claimed is:

1. A reverberation effect imparting system comprising:

a plurality of comb filter means arranged in parallel for receiving a common sound signal to which a reverberation effect is to be imparted, each of said comb filter means including a closed loop into which said common sound signal is received, each said closed loop having a delay element and a loop gain control, a first characteristic of said reverberation effect being controlled by controlling variable loop gain coefficients associated with each of said comb filter means;

takeout means for taking out at least one signal from each of said comb filter means;

junction means for outputting at least one junction output signal that is a function of said signals taken out by said takeout means, said function being controlled by at least one junction control signal comprising a plurality of independently variable junction coefficients respectively associated with each of said comb filter means, said at least one junction control signal controlling a second characteristic of said reverberation effect;

introduction means for introducing said at least one junction output signal into each of said comb filter means; and reverberation output means for extracting at least one signal from at least one of said comb filter means and outputting said at least one extracted signal as a reverberation output signal having said reverberation effect imparted thereto, wherein said first characteristic and said second characteristic of said reverberation effect imparted to said reverberation output signal are variable with respect to each other, said first characteristic increasing relative to said second characteristic as said junction control signal is decreased and said second characteristic increasing relative to said first characteristic as said junction control signal is increased, whereby an intermediate reverberation characteristic between said first reverberation characteristic and said second reverberation characteristic is achieved by controlling said junction control signal.

2. A reverberation effect imparting system as defined in claim 1 wherein said function is a sum of said junction coefficients respectively multiplied by said signals taken out of each of said plurality of comb filter means.

3. A reverberation effect imparting system as defined in claim 1 wherein said introduction means further comprises means for controlling respectively a level of said at least one junction output introduced into each of said plurality of comb filter means.

4. A reverberation effect imparting system as defined in claim 1 wherein the junction coefficients are controlled individually to satisfy a predetermined lossless condition.

5. A reverberation effect imparting system as defined in claim 1 wherein said introduction means includes arithmetic means located in the closed loop of each one of said plurality of comb filter means for arithmetically combining said at least one junction output signal from said junction means with a signal in each of said plurality of comb filter means.

6. A reverberation effect imparting system as defined in claim 1 wherein said reverberation output means includes means for taking out at least one additional signal from at least one of said comb filter means, synthesizing said taken out signals, and outputting said synthesized signals.

7. A reverberation effect imparting system comprising:

a plurality of comb filter means arranged in parallel for receiving a common sound signal to which a reverberation effect is to be imparted, each of said comb filter means including a closed loop into which said common sound signal is received, each said closed loop having a delay element and a loop gain control, a first characteristic of said reverberation effect being controlled by controlling variable loop gain coefficients associated with each of said comb filter means;

junction means for taking out at least one signal from each of said comb filter means modifying each of said taken out signals in accordance with independently variable scattering coefficients associated with each of said comb filter means, and synthesizing said modified signals into at least one junction output signal, said independently variable scattering coefficients controlling a second characteristic of said reverberation effect;

introduction means for introducing said at least one junction output signal into each of said comb filter means;

reverberation output means for extracting at least one signal from each of said comb filter means, synthesizing said extracted signals into at least one reverberation output signal, and outputting said at least one reverberation output signal having said reverberation effect imparted thereto; and dummy loop means for modifying said at least one junction output signal in accordance with a variable dummy coefficient and providing said at least one modified junction output signal to said junction means, wherein said first characteristic and said second characteristic of said reverberation effect imparted to said reverberation output signal are variable with respect to each other, said first characteristic increasing relative to said second characteristic as said variable scattering coefficients are decreased and said second characteristic increasing relative to said first characteristic as said variable scattering coefficients are increased, whereby an intermediate reverberation characteristic between said first reverberation characteristic and said second reverberation characteristic is achieved by controlling said variable scattering coefficients.

8. A reverberation effect imparting system as defined in claim 7 wherein said dummy loop means further comprises:

a dummy closed loop having a dummy delay element and a dummy operation element, means for introducing the junction output signal into said dummy closed loop, and operation means for taking out a signal from said dummy closed loop, multiplying the signal taken from said dummy closed loop by said variable dummy coefficient, and providing the modified signal to said junction means as said modified junction output signal.

9. A reverberation effect imparting system as defined in claim 8 wherein said dummy operation element of said dummy closed loop can be controlled by a coefficient.

10. A reverberation effect imparting system as defined in claim 7 wherein a value of said variable dummy coefficient in said dummy loop means varies in a complementary manner with respect to said variable scattering coefficients.

11. A reverberation effect imparting system as defined in claim 1 wherein said first characteristic of said reverberation effect comprises a reverberation time and said second characteristic comprises a reverberation amount.

12. A reverberation effect imparting system as defined in claim 7 wherein said dummy loop means further comprises a filter having a variable filter coefficient.

13. A reverberation effect imparting system as defined in claim 7 wherein a density of said reverberation effect is decreased by decreasing said variable scattering coefficients while increasing said dummy coefficient.

14. A reverberation effect imparting system as defined in claim 7 wherein both a density of said reverberation effect and a reverberation time of said reverberation effect are controlled by variably controlling said variable scattering coefficients and said dummy coefficient.

15. A reverberation effect imparting system as defined in claim 7 wherein a reverberation time of said reverberation effect and a density of said reverberation effect are controlled independently of each other by controlling said loop gains of respective ones of said plurality of comb filter means and said scattering coefficients.

* * * * *